US008772905B2

(12) United States Patent
Meotto et al.

(10) Patent No.: US 8,772,905 B2
(45) Date of Patent: Jul. 8, 2014

(54) INTEGRATION OF RESISTORS AND CAPACITORS IN CHARGE TRAP MEMORY DEVICE FABRICATION

(75) Inventors: Umberto M. Meotto, Rivoli (IT); Paolo Tessariol, Montebelluna (IT)

(73) Assignee: Micron Technology, Inc., Boise, ID (US)

( * ) Notice: Subject to any disclaimer, the term of this patent is extended or adjusted under 35 U.S.C. 154(b) by 110 days.

(21) Appl. No.: 13/132,312

(22) PCT Filed: Dec. 30, 2008

(86) PCT No.: PCT/IT2008/000812
§ 371 (c)(1),
(2), (4) Date: Jun. 1, 2011

(87) PCT Pub. No.: WO2010/076824
PCT Pub. Date: Jul. 8, 2010

(65) Prior Publication Data
US 2011/0248333 A1   Oct. 13, 2011

(51) Int. Cl.
*H01L 21/00* (2006.01)
(52) U.S. Cl.
USPC .......... 257/528; 257/329; 438/210; 438/238; 438/381
(58) Field of Classification Search
USPC ......... 257/296, 300, 316, 359, 368, 516, 528, 257/652; 438/201, 210, 238, 241, 257, 266, 438/396, 622, 381
See application file for complete search history.

(56) References Cited

U.S. PATENT DOCUMENTS

| 6,417,545 | B1* | 7/2002 | Sakaguchi | 257/368 |
| 7,968,924 | B2* | 6/2011 | Sato | 257/296 |
| 2003/0080366 | A1* | 5/2003 | Tamura | 257/298 |
| 2004/0124477 | A1* | 7/2004 | Minami et al. | 257/379 |
| 2006/0208338 | A1* | 9/2006 | Lee et al. | 257/516 |
| 2007/0117327 | A1* | 5/2007 | Lee et al. | 438/266 |
| 2007/0258289 | A1* | 11/2007 | Lue | 365/185.18 |

FOREIGN PATENT DOCUMENTS

WO   WO-2010076824 A1   7/2010

OTHER PUBLICATIONS

"International Application Serial No. PCT/IT2008/000812, Written Opinion mailed Jun. 30, 2011", 5 pgs.
"International Application Serial No. PCT/IT2008/00812, International Search report mailed Aug. 27, 2010", 2 pgs.

* cited by examiner

*Primary Examiner* — Errol Fernandes
(74) *Attorney, Agent, or Firm* — Schwegman, Lundberg & Woessner, P.A.

(57) ABSTRACT

A semiconductor device structure and method to form the same. The semiconductor device structure includes a nonvolatile charge trap memory device and a resistor or capacitor. A dielectric layer of a charge trap dielectric stack of the memory device is patterned to expose a portion of a first conductive layer peripheral to the memory device. A second conductive layer formed over the dielectric layer and on the exposed portion of the first conductive layer is patterned to form resistor or capacitor contacts and capacitor plates.

16 Claims, 4 Drawing Sheets

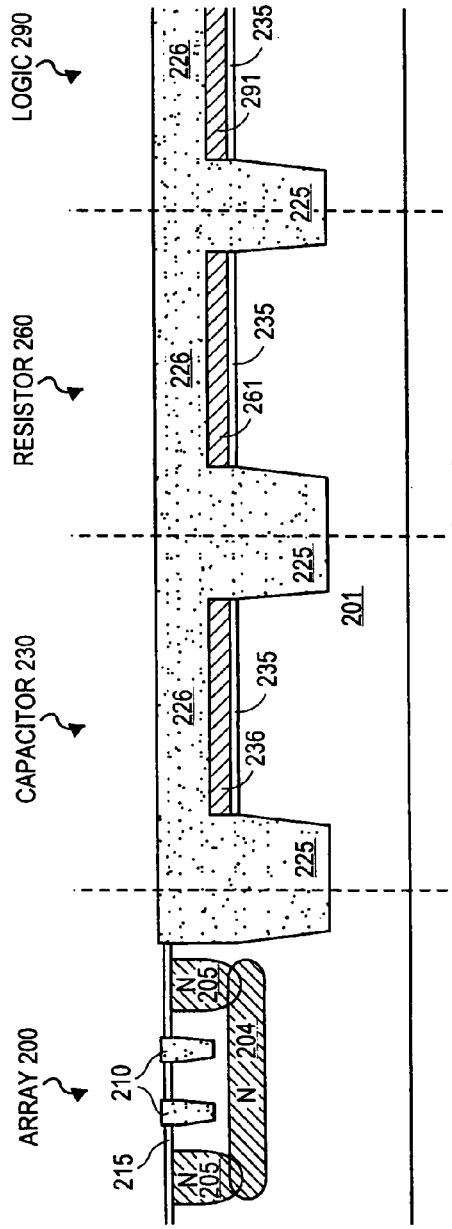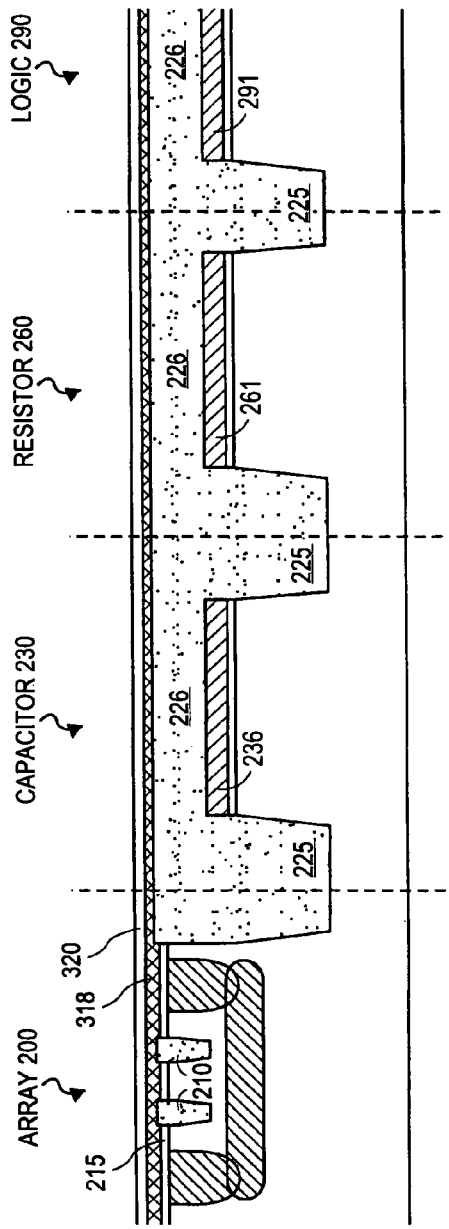
FIG. 2
FIG. 3

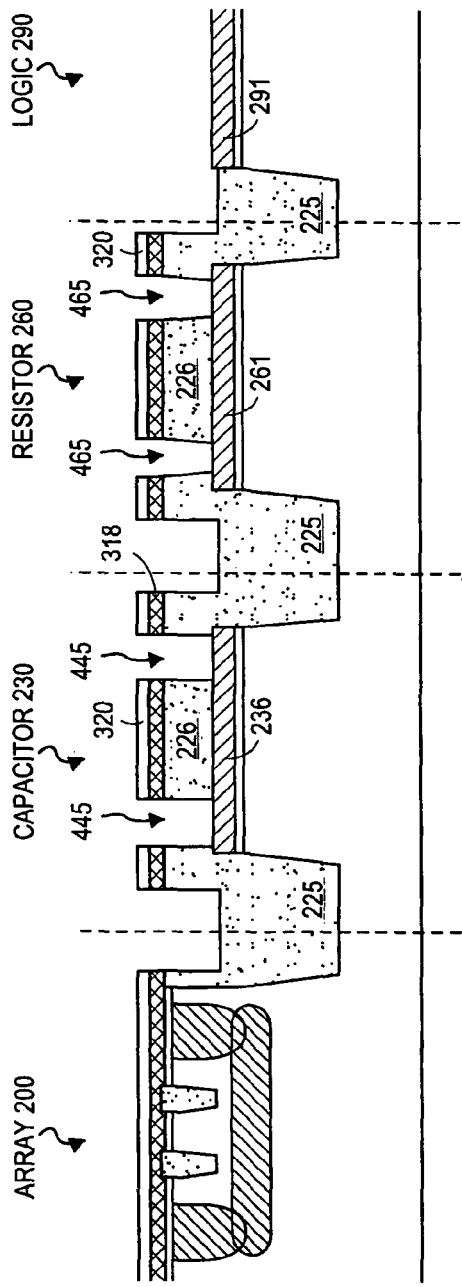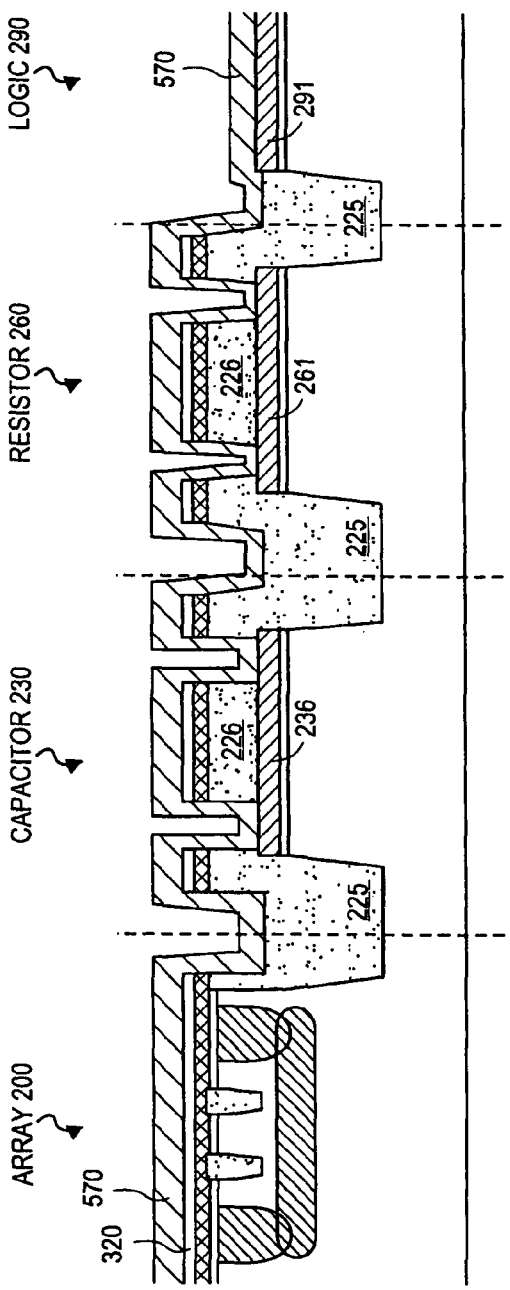

INTEGRATION OF RESISTORS AND CAPACITORS IN CHARGE TRAP MEMORY DEVICE FABRICATION

CROSS REFERENCE TO RELATED APPLICATION

This patent application is a U.S. National Phase application under 35 U.S.C. §371 of International Application No. PCT/IT2008/000812, filed on Dec. 30, 2008, entitled INTEGRATION OF RESISTORS AND CAPACITORS IN CHARGE TRAP MEMORY DEVICE FABRICATION.

TECHNICAL FIELD

The invention is in the field of semiconductor devices, more specifically pertaining to non-volatile charge trap memory devices integrated with resistors or capacitors.

BACKGROUND

Non-volatile memory (NVM) generally utilizes a charge trap layer to store charge and provide non-volatility. NVM is typically fabricated on a substrate into arrays of memory cells, each cell including a charge trap memory device. Along with a memory array, high and low voltage logic devices, such as complementary metal oxide semiconductor (CMOS) transistors, as well as thin film resistors and metal-insulator-metal (MIM) capacitors may be fabricated in peripheral regions of the substrate to form an integrated circuit (IC) device.

Integration of the various active and passive devices in an IC device is increasingly challenging as the NVM and logic devices independently scale to smaller dimensions and higher densities. In addition to the greater expense associated with patterning a feature with smaller dimensions, scaling may also entail new materials, such as high-k materials (i.e., materials with a dielectric constant $\in$ greater than that of silicon nitride) and metal gate layers, that may necessitate more complex process flows, multiplying the number of patterning (lithography and etch) operations to further increase costs. Methods of fabricating IC devices having a reduced number of patterning operations are therefore desirable.

BRIEF DESCRIPTION OF THE DRAWINGS

Embodiments of the present invention are illustrated by way of example, and not limitation, in the figures of the accompanying drawings in which:

FIG. 2 illustrates a cross-sectional view representing particular operations in the formation of a semiconductor structure in which a conductive layer is patterned into a capacitor plate, a resistor and a logic gate, in accordance with an embodiment of the present invention;

FIG. 3 illustrates a cross-sectional view representing particular operations in the formation of a semiconductor structure in which a charge trapping dielectric stack is formed, in accordance with an embodiment of the present invention;

FIG. 4 illustrates a cross-sectional view representing operations in the formation of a semiconductor structure in which a charge trapping dielectric stack is patterned to expose a portion of a capacitor plate and a resistor, in accordance with an embodiment of the present invention;

FIG. 5 illustrates a cross-sectional view representing operations in the formation of a semiconductor structure in which a conductive layer is deposited over the charge trapping dielectric stack and on the exposed portion of the gate layer, in accordance with an embodiment of the present invention.

DETAILED DESCRIPTION

Embodiments of a non-volatile charge trap memory device integrated with resistors and capacitors are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
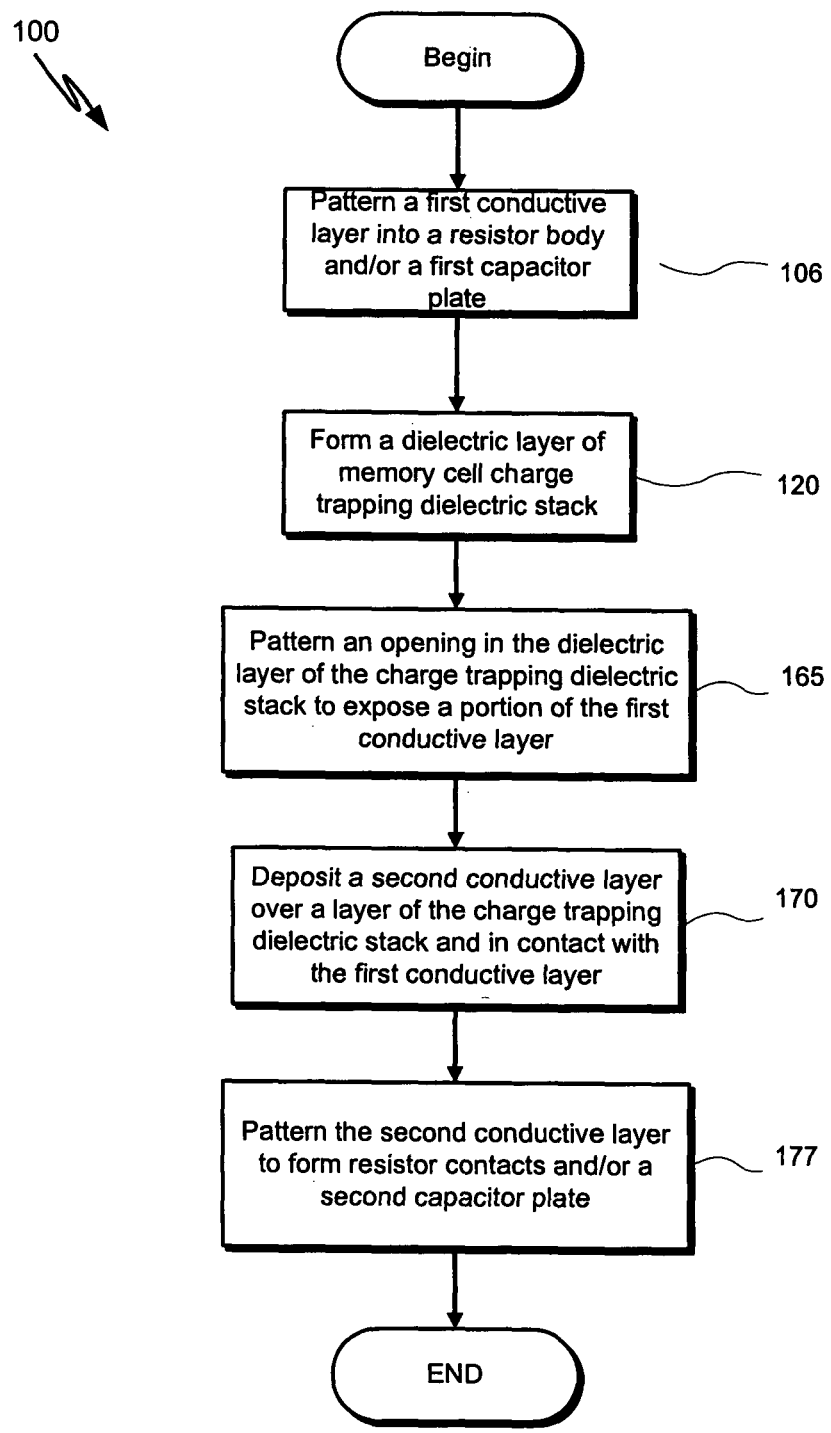
FIG. 1 illustrates a flow diagram depicting sequences of particular modules employed in the fabrication process of a non-volatile charge trap memory device integrated with a thin film resistor and capacitor, in accordance with particular embodiments of the present invention.

FIG. 1 illustrates a flow diagram depicting sequences of particular modules employed in an exemplary fabrication method 100 of a non-volatile charge trap memory device, such as a NAND memory device stack, integrated with resistors and capacitors, in accordance with particular embodiments of the present invention. Generally, the method 100 exemplifies patterning of a dielectric layer employed in the charge trapping dielectric stack of a memory device to selectively expose portions of features present in regions peripheral to a memory cell array or inside a memory cell array. The dielectric layer of the charge trapping dielectric stack, though useful in a memory device, may serve no purpose beyond the memory device and may even be an undesirable artifact (e.g., having a potentially high capacitance) detrimental to performance of non-memory devices (CMOS logic devices) peripheral to the memory device. However, rather than merely removing a dielectric layer of the charge trapping dielectric stack from all peripheral regions, patterning of the charge trapping dielectric stack is such that resistors or capacitors in the peripheral regions may be formed.

As depicted, the method 100 begins with patterning of a first conductive layer at operation 106. FIG. 2 illustrates a cross-sectional view representing an exemplary intermediate device structure after performing operation 106. The dashed lines of FIG. 2 represent divisions between different regions formed in a single substrate 201. In the particular embodiment depicted in FIG. 2, the patterning of the first conductive layer forms each of a first capacitor plate 236 of a capacitor 230, a resistor body 261 of a resistor 260 and a gate layer 291 of logic region 290. The gate layer 291 represents either a transistor gate or local interconnect connecting transistor gates. While each of these structures is depicted in FIG. 2, in other embodiments, one or more may be practiced as subsets of the depicted combination. In still other embodiments, patterning of the first conductive layer may form additional features such as a portion of a conductive trace not directly coupled to a transistor gate (not depicted). Each device (e.g., the first capacitor plate 236 or resistor body 261), may be patterned to have dimensions depending upon desired function, parametrics and layout constraints.

As shown in FIG. 2, an array region 200 includes a tunnel dielectric layer 215 disposed on a substrate 201. The tunnel dielectric layer 215 may be any material and have any thickness allowing charge carriers to tunnel into a charge-trapping layer under a high gate bias condition while maintaining a suitable barrier to leakage under conditions of low gate bias. In certain embodiments, the tunnel dielectric layer 215 is a commonly known dielectric layer, such as silicon dioxide ($SiO_2$), a silicon oxynitride ($SiO_xN_y(H_z)$), a silicon dioxide that is subsequently nitrided, or a stack dielectric made of silicon dioxide and silicon nitride ($Si_3N_4$) or silicon oxynitride, having a physical thickness of between about 1.0 nm and 15.0 nm. In another embodiment, the tunnel dielectric layer 215 is comprised of a material having a dielectric constant greater than that of silicon nitride which may include, but is not limited to, hafnium oxide, zirconium oxide, hafnium silicate, hafnium oxy-nitride, hafnium zirconium oxide and lanthanum oxide or a combination of such dielectric layers.

The substrate 201 may be a bulk substrate comprised of a single crystal of a material which may include, but is not limited to, silicon, germanium, silicon/germanium or a III-V compound semiconductor material. In another embodiment, the substrate 201 is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In another embodiment, the substrate is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxy-nitride. The lower bulk layer is comprised of a single crystal which may include, but is not limited to, silicon, germanium, silicon/germanium, a III-V compound semiconductor material and quartz.

The substrate 201 may further include doped regions, such as n-wells 204 and 205 forming a triple-well configuration. Formation of the n-wells 204 and 205 typically includes forming a patterned photo mask on a sacrificial dielectric layer, such as a silicon dioxide layer. In certain embodiments, n-well formation includes implanting a phosphorus species at concentrations and energies conventional for MOS devices. Although not depicted in FIG. 2, wells (N or P type) may also be formed in other portions of substrate 201, such as in the logic region 290. The doped regions of substrate 201 may further include any number of channel implants to adjust threshold voltages for specific device applications. A channel implant may be of any conventional species (e.g. $BF_2$ for an n-channel), dose and energy.

The exemplary embodiment depicted in FIG. 2 further includes isolations regions, such as a shallow trench isolation (STI) region 210 in the array region 200. The array region 200 may be further isolated from non-array regions, such as logic region 290, by a deep trench isolation region 225. While deep trench isolation region 225 may provide advantageous radio frequency (RF) isolation, STI regions may also be a viable alternative, depending on the application. As further depicted, any of the first capacitor plate 236, the resistor body 261 and the gate layer 291 may be self-aligned to an active area of the substrate 201 between portions of the deep trench isolation region 225. In such embodiments, the deep trench isolation region 225 may be formed using a same mask used for patterning any of the first capacitor plate 236, the resistor body 261 and the gate layer 291. In alternative embodiments, any of the first capacitor plate 236, the resistor body 261 and the gate layer 291 may be non-self-aligned with an active area of the substrate 201 such that they are disposed over a portion of an isolation regions (e.g., disposed over deep trench isolation region 225).

Depending on the embodiment, any of the first capacitor plate 236, the resistor body 261 and the gate layer 291 may be formed over a dielectric 235. The dielectric 235 may be any conventional material, such as a pad oxide or a gate dielectric material (e.g., silicon dioxide, silicon nitride, high-k dielectrics having a dielectric constant greater than silicon nitride) and may be a different thickness and/or material depending on the region within the integrated circuit. As also depicted in FIG. 2, an additional dielectric layer 226 may be formed over any of the first capacitor plate 236, the resistor body 261 and the gate layer 291. However, in alternate embodiments, dielectric layer 226 is absent.

Returning to operation 120 of FIG. 1, a dielectric layer of a charge trapping dielectric stack is formed over both the array region and peripheral regions. The dielectric layer may be any dielectric layer of a charge trapping dielectric stack. In the exemplary embodiment depicted in FIG. 3, the dielectric layer formed is a charge trapping layer 318 of a charge trapping dielectric stack of a memory cell in array region 200. As shown, the charge trapping layer 318 is also formed over peripheral (non-array) regions, such as capacitor 230, resistor 260 and logic region 290 but in an alternative embodiment the charge trapping layer 318 is self-aligned to the array region 200 (e.g., etched during active area definition) such that the charge trapping layer 318 does not extend beyond array region 200. The charge trapping layer 318 may be any commonly known charge trapping material and have any thickness suitable to store charge and, modulate the threshold voltage of the devices. In certain embodiments, the charge trapping layer 318 is trap-rich silicon nitride or silicon oxynitride or a stack of different dielectric layers. The charge trapping layer 318 may have a physical thickness between approximately 1 nm and 20 nm. The charge trapping layer 318 may be formed by any conventional means. In one particular embodiment, the charge trapping layer 318 is deposited using a low pressure CVD process employing a silicon source, such as silane ($SiH_4$), dichlorosilane ($SiH_2Cl_2$), tetrachlorosilane ($SiCl_4$) or Bis-TertiaryButylAmino Silane (BTBAS), a nitrogen source, such as $N_2$, $NH_3$, $N_2O$ or nitrogen trioxide ($NO_3$), and an oxygen-containing gas, such as $O_2$ or $N_2O$.

In the exemplary embodiment depicted in FIG. 3, a blocking dielectric layer 320 is deposited over the array region 200 and non-array regions including any of capacitor 230, resistor 260 and logic region 290. As depicted, the blocking dielectric layer 320 may be deposited directly on the charge trapping layer 318. For those embodiments where the charge trapping layer 318 is self aligned to the array region 200, the blocking dielectric layer 320 is deposited on the charge trapping layer 318 in the array region 200 and over peripheral regions, such as capacitor 230, resistor 260 and logic region 290 (e.g., on the dielectric layer 226). The blocking dielectric layer 320 may be any commonly known material with any thickness suitable to maintain a barrier to charge leakage without significantly decreasing the capacitance of the gate stack. In one embodiment the blocking dielectric layer 320 is of a material having a higher dielectric constant than silicon nitride. The blocking dielectric layer 320 may include, but is not limited to, aluminum oxides, aluminides, hafnium oxide, zirconium oxide, tantalum oxide, hafnium silicate, hafnium oxy-nitride, hafnium zirconium oxide and lanthanoid oxides (e.g., lanthanum oxide). In another embodiment, the second blocking dielectric layer 320 is silicon dioxide layer, silicon oxynitride layer, a silicon dioxide and silicon nitride stack or a stack of different dielectrics know in the art to form good blocking layers. Exemplary thicknesses of the blocking dielectric layer 320 are between about 2 nm and about 50 nm.

The blocking dielectric layer 320 can be formed by any suitable means including, for example, thermal oxidation or deposition with CVD techniques. In a particular embodiment, the blocking layer is a deposited film formed with a high-temperature CVD process. Preferably, the blocking dielectric layer 320 is deposited sequentially in the same processing tool employed to form the charge trapping layer 318. With the tunnel dielectric layer 215, charge trapping layer 318 and the blocking dielectric layer 320 formed, a charge trapping dielectric stack for a NVM cell may be substantially complete (thermal anneals and the like may yet to be performed).

Returning to FIG. 1, at operation 165, an opening is patterned into at least one dielectric layer of a charge trapping dielectric stack. In an embodiment, at least one of the tunnel dielectric layer 215, charge trapping layer 318 or blocking dielectric layer 320 is removed at operation 165 to expose less than all of at least one of the first capacitor plate 236, resistor body 261. Conventional lithography and etching techniques may be employed to selectively remove at least one of the dielectric layers in a charge trapping dielectric stack from regions of the substrate peripheral to the array region 200. Patterning may be performed concurrently within the array region 200. In embodiments, the patterning of at least one dielectric layer of the charge trapping dielectric stack is such that at least a portion of the patterned dielectric layer is retained over the peripheral regions. In a particular embodiment, dielectric layers of the charge trapping dielectric stack are patterned to only remove selected portions disposed above any of the first capacitor plate 236, resistor body 261 or gate layer 291. In an embodiment, at least a single contact to either or both of the first capacitor plate 236 and the resistor body 261 is formed at operation 165, where the single contact has a layout area less than the layout area of the first capacitor plate 236 and resistor body 261. In one such embodiment, as depicted in FIG. 4, two portions of the charge trapping dielectric stack disposed above the first capacitor plate 236 are removed at operation 165 to expose two distinct regions of the first capacitor plate 236 (i.e., forming capacitor contact openings 445).

As depicted, the patterning performed at operation 165 etches both the blocking dielectric layer 320 and the charge trapping layer 318. The etch at operation 165 may further remove any of the additional dielectric layer 226 disposed over the first capacitor plate 236, as depicted in FIG. 4. Portions of a dielectric layer of the charge trapping dielectric stack disposed over the resistor body 261 may be similarly patterned to form thin film resistor contact openings 465. As further depicted in FIG. 4, dielectric layers over the gate layer 291 may also be etched during operation 165 to completely expose the gate layer 291 (e.g., the charge trapping dielectric stack is removed everywhere the gate layer 291 is present). Furthermore, the charge trapping dielectric stack may also be etched from deep trench isolation regions 225 as depicted in FIG. 4 to limit incorporation of relatively highly capacitive dielectrics from field regions. However, in alternate embodiments not depicted, the charge trapping dielectric stack is retained over deep trench isolation regions 225.

Depending on the feature sizes being defined, either or both of a dry etch and wet etch may be employed to remove the portions of the charge trapping dielectric stack from the non-array regions selectively to the first conductor patterned as the first capacitor plate 236, resistor body 261 or gate layer 291. Any conventional wet etchant, such as buffered oxide etchant (BOE), or conventional halogen-based plasma etch may be employed in the patterning of either or both of the blocking dielectric layer 320 and charge trapping layer 318 (or tunnel dielectric layer 215 if disposed over any of the first capacitor plate 236, resistor body 261 or gate layer 291). In a particular embodiment, a dry etch is performed to achieve a good stack sidewall profile with minimal undercut and high selectivity to a poly-silicon or metal first capacitor plate 236, resistor body 261 or gate layer 291.

Returning to FIG. 1, following the charge trapping dielectric stack patterning of operation 165, the method 100 proceeds to operation 170. At operation 170, a second conductive layer is deposited over a dielectric layer of the charge trapping dielectric stack. In the particular embodiment depicted in FIG. 5, low resistivity gate layer 570 is deposited over both the charge trapping dielectric stack (e.g., on the blocking dielectric layer 320) and over the first capacitor plate 236, resistor body 261 or gate layer 291. As shown, the gate layer 570 makes a plurality of contacts to each of the first capacitor plate 236 and resistor body 261. As further shown, the gate layer 570 overlays the gate layer 291 for lower resistivity.

The gate layer 570 may be formed with any process conventionally known in the art. The gate layer 570 may be of any conductor or semiconductor material employed for gate layers in the art. In one embodiment, the gate layer 570 contains a metal, such as, but not limited to, hafnium, zirconium, titanium, tantalum, aluminum, ruthenium, palladium, platinum, cobalt and nickel, their silicides, their nitrides and their carbides. In other embodiments, the gate layer 570 is poly-silicon (p-silicon).

Returning to FIG. 1, at operation 177, the second conductive layer is patterned to form any of capacitor contracts, a second capacitor plate, a transmission line or resistor contacts. As depicted in the exemplary embodiment of FIG. 6, the gate layer 570 is patterned to delineate both a second capacitor plate 636 and capacitor contacts 637. In such an embodiment, the first capacitor plate 236 and the second capacitor plate 636 form a MIM capacitor utilizing at least one dielectric layer from the charge trapping dielectric stack of the NVM as an insulator between the plates. Depending on the embodiment, a capacitor insulator may or may not include additional dielectric layers between the first capacitor plate 236 and the second capacitor plate 636.

Although not depicted, it should be appreciated that the capacitor 230 may be reconfigured to form a transmission line, such as a microstrip transmission line. For example, a first conductive layer may be patterned into three regions spanning the x-sectional dimension of the first capacitor plate 236, with the center of the three regions providing a signal wire. Contacts may then be landed on first conductor portions surround the signal wire (e.g., similar to capacitor contacts 637), with the second conductor forming a continuous metal with the contacts to ground three sides about the signal wire (e.g., the conductor structure of capacitor 230 is inverted). In this manner, the separate patterning of the first and second conductors in method 100 may be utilized to form a transmission line having characteristic impedance, $Z_0$, determined by a signal line width and height, and the dielectric parameters of the charge trapping dielectric stack.

Figure 6:
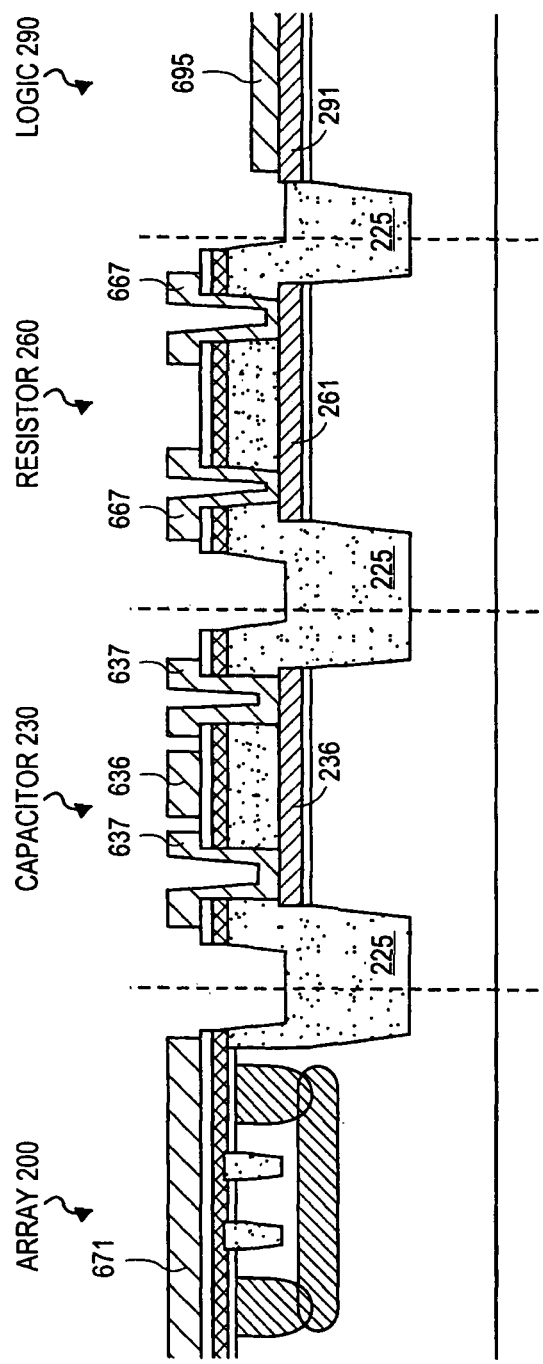
FIG. 6 illustrates a cross-sectional view representing operations in the formation of a semiconductor structure in which the conductive layer is patterned to resistor contacts, capacitor contacts, a capacitor plate and a logic gate layer, in accordance with an embodiment of the present invention.

As further shown in FIG. 6, the gate layer 570 may be further patterned to delineate resistor contacts 667. In this manner, resistor heads may be formed defining the resistive length of the resistor body 261. In further embodiments, gate layer 570 also forms a conductive gate 695 overlaying the gate layer 291 in the logic region 290 and forms a conductive layer 671 in the array region 200. In the array region 200, the conductive layer 671 is disposed over the charge trapping dielectric stack of a NVM cell, such as a NAND memory cell. The gate layer 570 may be patterned with any conventional gate etch process, dependent on the material system chosen for the gate layer 570. In a particular embodiment, the patterning of gate layer 570 is performed with a dry etch stopping on a dielectric layer of the charge trapping dielectric stack (to protect the substrate 201 in the array region 200).

Upon completion of operation 177, the method 100 is substantially complete and fabrication of the semiconductor devices may then proceed with any sequence conventional to the art. Backend dielectrics and metallization processes may be performed to interconnect various ones in the array region 200, capacitor 230, resistor 260 and logic region 290. For example, vias may be formed to any of the conductive layer 671, capacitor contacts 637, second capacitor plate 636, resistor contacts 667 or conductive gate 695.

As shown in FIG. 6, method 100 provides a semiconductor device structure including both an array region 200 including at least one NMV memory cell which utilizes a non-volatile charge trapping dielectric stack and a peripheral region (e.g., either of capacitor 230 or resistor 260) retaining a dielectric layer of the non-volatile charge trapping dielectric stack disposed over a first conductor (e.g., either of first capacitor plate 236 or resistor body 261). In the exemplary embodiment, capacitor contacts 637 and resistor contacts 667 are formed though charge trapping dielectric stack such that at least one dielectric layer of the charge trapping dielectric stack is disposed over only a portion (less than all) of the first conductor. As depicted in FIG. 6, each of the capacitor contacts 637 and resistor contacts 667 include a first and a second conductive contact disposed over a dielectric layer of the charge trapping dielectric stack to account for feature dimension and overlay tolerances.

Thus, a semiconductor structure integrating charge trap memory devices with resistors and capacitors and method to form the same has been disclosed. Although the present invention has been described in language specific to structural features or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method of fabricating a semiconductor device structure, the method comprising:
    forming a dielectric layer of a charge trapping dielectric stack for a non-volatile memory cell, the dielectric layer being disposed over a first conductor peripheral to the memory cell;
    patterning the dielectric layer to expose a portion of the first conductor;
    forming a conductive material over the dielectric layer and in contact with the exposed portion of the first conductor; and
    patterning the conductive material to form circuitry including the first conductor and to form a portion of the memory cell, the patterning of the conductive material further comprising removing a portion of the conductive material to form a second conductor disposed over the first conductor, the second conductor being electrically isolated from a portion of the conductive material contacting the first conductor, the first conductor and the second conductor being dimensioned to form a capacitor.

2. The method of claim 1, wherein the first conductor is a patterned layer disposed over a semiconductor substrate or is a doped region of the semiconductor substrate.

3. The method of claim 1, wherein the dielectric layer is a charge trapping layer of the charge trapping dielectric stack.

4. The method of claim 1, wherein patterning the dielectric layer further comprises: forming, in the dielectric layer, a first contact opening and a second contact opening spaced apart from one another to expose two distinct regions of the first conductor.

5. The method of 1, wherein patterning the conductive material further comprises retaining a second portion of the conductive material contacting the first conductor to form conductive heads of a resistor.

6. The method of claim 1, wherein the dielectric layer is a silicon nitride or a high-k dielectric having a dielectric constant greater than a silicon nitride and wherein the first conductor is a patterned poly-silicon or metal feature.

7. The method of claim 1, wherein the memory cell is a NAND memory cell.

8. A semiconductor device structure, comprising:
    a memory cell region of a substrate, the memory cell region including a non-volatile charge trapping dielectric stack;
    a peripheral region of the substrate, the peripheral region including a dielectric layer of the non-volatile charge trapping dielectric stack disposed over a first conductor;
    circuitry formed from a conductive material including the first conductor to form a portion of the semiconductor device structure as a resistor element; and
    a second conductor disposed over the first conductor, the second conductor being electrically isolated from a portion of the conductive material contacting the first conductor, the first conductor and the second conductor being dimensioned to form a capacitor.

9. The semiconductor device structure of claim 8, wherein the dielectric layer is disposed over only a portion of the first conductor.

10. The semiconductor device structure of claim 8, wherein the first conductor is a patterned layer disposed over a semiconductor substrate or is a doped region of the semiconductor substrate.

11. The semiconductor device structure of claim 8, wherein the dielectric layer is a charge trapping layer of the charge trapping dielectric stack.

12. The semiconductor device structure of claim 8, further comprising:
   a first conductive contact and a second conductive contact disposed over the dielectric layer, wherein each of the first conductive contact and the second conductive contact is electrically coupled with a distinct portion of the first conductor.

13. The semiconductor device structure of claim 12, wherein a portion of the first conductor forms a resistor.

14. The semiconductor device structure of claim 8, wherein the dielectric layer is a silicon nitride or a high-k dielectric having a dielectric constant greater than the silicon nitride and wherein the first conductor is a patterned poly-silicon or a metal feature.

15. A method of fabricating a semiconductor device structure, the method comprising:
   patterning a conductive layer into a transistor gate and at least one of a capacitor plate or a resistor in a peripheral region of the semiconductor device;
   depositing a dielectric layer as part of a non-volatile charge trapping dielectric stack of a memory cell in an array region of the semiconductor device; and
   patterning a portion of the dielectric layer disposed over the peripheral region to expose the entire transistor gate, but expose only a portion of the capacitor plate or expose only a portion of the resistor.

16. The method of claim 15, further comprising forming a conductive layer on the non-volatile charge trapping dielectric stack, on the transistor gate and in contact with the portion of the capacitor plate or resistor.

\* \* \* \* \*

UNITED STATES PATENT AND TRADEMARK OFFICE
CERTIFICATE OF CORRECTION

| | | |
|---|---|---|
| PATENT NO. | : 8,772,905 B2 | Page 1 of 1 |
| APPLICATION NO. | : 13/132312 | |
| DATED | : July 8, 2014 | |
| INVENTOR(S) | : Umberto M. Meotto et al. | |

It is certified that error appears in the above-identified patent and that said Letters Patent is hereby corrected as shown below:

In the Claims:

In column 8, line 41, in Claim 5, delete "of 1," and insert -- of claim 1, --, therefor.

Signed and Sealed this
Thirtieth Day of September, 2014

Michelle K. Lee
*Deputy Director of the United States Patent and Trademark Office*